(12) United States Patent
Kishida

(10) Patent No.: US 6,170,039 B1
(45) Date of Patent: Jan. 2, 2001

(54) MEMORY CONTROLLER FOR INTERCHANGING MEMORY AGAINST MEMORY ERROR IN INTERLEAVE MEMORY SYSTEM

(75) Inventor: Yuichi Kishida, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/080,308

(22) Filed: May 18, 1998

(30) Foreign Application Priority Data

May 16, 1997 (JP) .................................................... 9-143549

(51) Int. Cl.[7] ............................. G06F 12/00; G06F 12/06
(52) U.S. Cl. .................................. 711/127; 711/5; 714/48
(58) Field of Search ............................ 711/127, 5, 129; 714/28, 48

(56) References Cited

U.S. PATENT DOCUMENTS

| 4,823,252 | * | 4/1989 | Horst et al. ............................... 714/7 |
| 5,659,713 | * | 8/1997 | Goodwin et al. ..................... 711/157 |
| 5,684,973 | * | 11/1997 | Sullivan et al. .......................... 711/5 |

FOREIGN PATENT DOCUMENTS

| 0239299 | * | 3/1987 | (EP) . |
| 55-032188 | | 3/1980 | (JP) . |
| 55-052600 | | 4/1980 | (JP) . |
| 61-020164 | | 1/1986 | (JP) . |
| 62-002339 | | 1/1987 | (JP) . |
| 64-017128 | | 1/1989 | (JP) . |
| 64-076341 | | 3/1989 | (JP) . |
| 1-111246 | | 4/1989 | (JP) . |
| 5-006305 | | 1/1993 | (JP) . |
| 10-301842 | | 11/1998 | (JP) . |

* cited by examiner

Primary Examiner—John W. Cabeca
Assistant Examiner—Brian R. Peugh
(74) Attorney, Agent, or Firm—Sughrue, Mion, Zinn, Macpeak & Seas, PLLC

(57) ABSTRACT

In a memory system having a plurality of banks which forms interleave groups for independently forming an interleave, when a memory error is detected in an operating system resident space, the group having the error is interchanged with another group that has not had any error yet. After a group interchange, a page having the error is also deallocated. When a determination is made that the group interchange causes deterioration of performance, a bank deallocation can be also executed. As this criterion for determination, it is possible to employ a policy that a bank is deallocated when a capacity of a bank including an erroneous sub-bank is equal to or less than a predetermined rate of all the memory capacity and an interleaving factor is less than the interleaving factor of an interchange partner after the bank deallocation.

17 Claims, 10 Drawing Sheets

MEMORY CONTROLLER FOR INTERCHANGING MEMORY AGAINST MEMORY ERROR IN INTERLEAVE MEMORY SYSTEM

BACKGROUND OF THE INVENTION

The present invention relates to a memory controller. In particular, the present invention relates to a memory controller for interchanging a memory when a memory error occurs in an interleave memory system.

For a memory device of a computer such as a main storage, an interleave system has been heretofore employed in order to allow access at high speed. In the interleave system, an address is exclusively given to a set of a plurality of memories (hereinafter, called a bank) that can be accessed in parallel. In this case, if the object bank is different, a new access can be made in parallel to another bank without waiting for the end of access of the object bank during execution. Particularly, the bank addresses are often given so that different banks may be sequentially used when the addresses to the memory are continuous, utilizing the characteristic that continuous access to the memory is often executed in an ascending or descending sequence.

On the other hand, since memory capacity required for an information processing system is different depending on users' needs or the object to be processed, the memory capacity may be varied in many information processing systems. Therefore, users are capable of selecting adequate memory capacity within the permissible range of the information processing system, and expanding the memory capacity later, depending on the memory requirements. In order to realize such a requirement, a memory device may be composed of a loading unit called a memory module.

A correspondent relationship between the memory module and the bank may be assumed to have any of the following cases: a case in which one memory module forms one bank; a case in which a plurality of banks are included in one memory module; and a case in which one bank is formed of a plurality of memory modules. Moreover, only one type of memory module is sometimes provided, while it is also probable that a larger capacity memory module may be provided because of the change in a generation of memory chip capacity.

If a memory module of different capacity is provided, it is important for protection of hardware resources of users to allow the use of a new large capacity module in combination with an old small capacity module. In order to allow co-existence of memory modules having different capacities, it is required to introduce a method of supplying addresses without any inconsistent problem with various combinations of different memory modules. In one conceivable method, the continuous addresses start from the maximum address before expansion are given to the expanded memory modules. In this case, since the interleave in the added address areas is executed in a closed manner within the expanded memory modules, the expanded memory modules are required to have the sufficient number of banks. However, since the depth in the address direction increases for the bit width with increase of capacity of a memory chip, the memory capacity consequently increases in the memory modules having a plurality of banks. It is thus impossible to provide memory modules of a small expansion unit.

Therefore, the applicant has proposed a technique in which, in order to keep the expansion unit small and to acquire an interleaving factor (a degree of multiplexing or the number of ways), an interleave is variable depending on the structure of memory device and memory module and also the interleave is capable of extending over the expanded modules and those already provided.

On the other hand, in order that an operating system (OS) is normally operated on the main storage, there may be a need to fixedly acquire a constant continuous space which is error free (without error) from a predetermined address (for example, address "0") of a physical address. In this case, if a memory error is occurred, the problem cannot be solved by deallocating a page alone including an erroneous area (by deallocating the page). The whole memory module including the error is therefore deallocated, and thus performance is considerably deteriorated.

SUMMARY OF THE INVENTION

In order to solve the above problems, it is an object of the present invention to provide a method of avoiding an error without losing a large capacity memory when a memory error is detected in the kernel resident area.

According to one preferred embodiment, a memory controller of the present invention is used for a storage device for forming interleave groups by dividing each of a plurality of memory banks into sub-banks and then combining sub-banks belonging to different memory banks, and the memory controller generates addresses in the banks of a plurality of memory banks so as to form an interleave within each of the interleave groups in accordance with the address of the storage device. In the memory controller, when a memory error is occurred in any one of the interleave groups, the interleave group having the memory error is interchanged with another interleave group so as to generate the address.

BRIEF DESCRIPTION OF THE DRAWINGS

The above-mentioned and other objects, features and advantages of this invention will become more apparent by reference to the following detailed description of the invention taken in conjunction with the accompanying drawings in which.

DETAILED DESCRIPTION OF THE PREFERRED EMBODIMENTS

An embodiment of the present invention will be described in detail with reference to the accompanying drawings.

Figure 1:
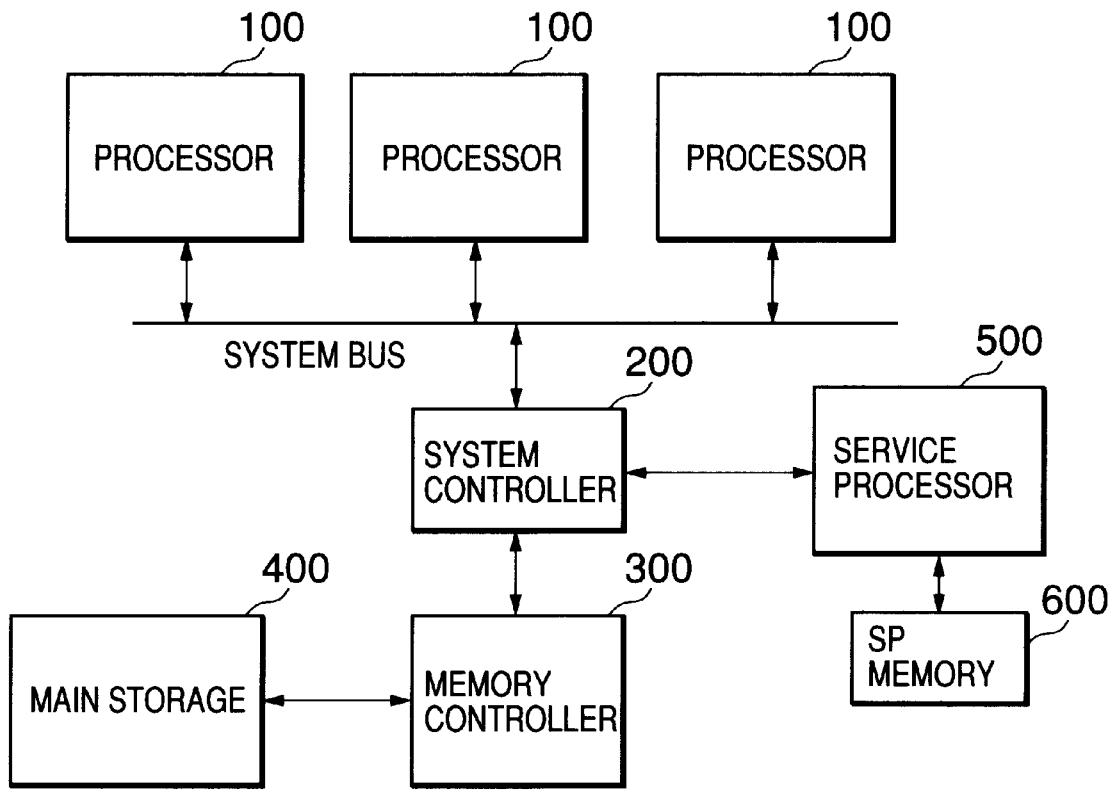
FIG. 1 is a block diagram showing a configuration of the embodiment of a computer system to which the present invention is applied.

Referring to FIG. 1, a computer system, which the embodiment of the present invention is applied to, comprises at least one processor 100, a system controller 200 connected to the processor 100 through a system bus, a memory controller 300 connected to the system controller 200, a main storage 400 connected to the memory controller, a service processor (SVP) 500 connected to the system controller 200 and a service processor memory (SPM) 600 connected to the service processor 500.

Figure 2:
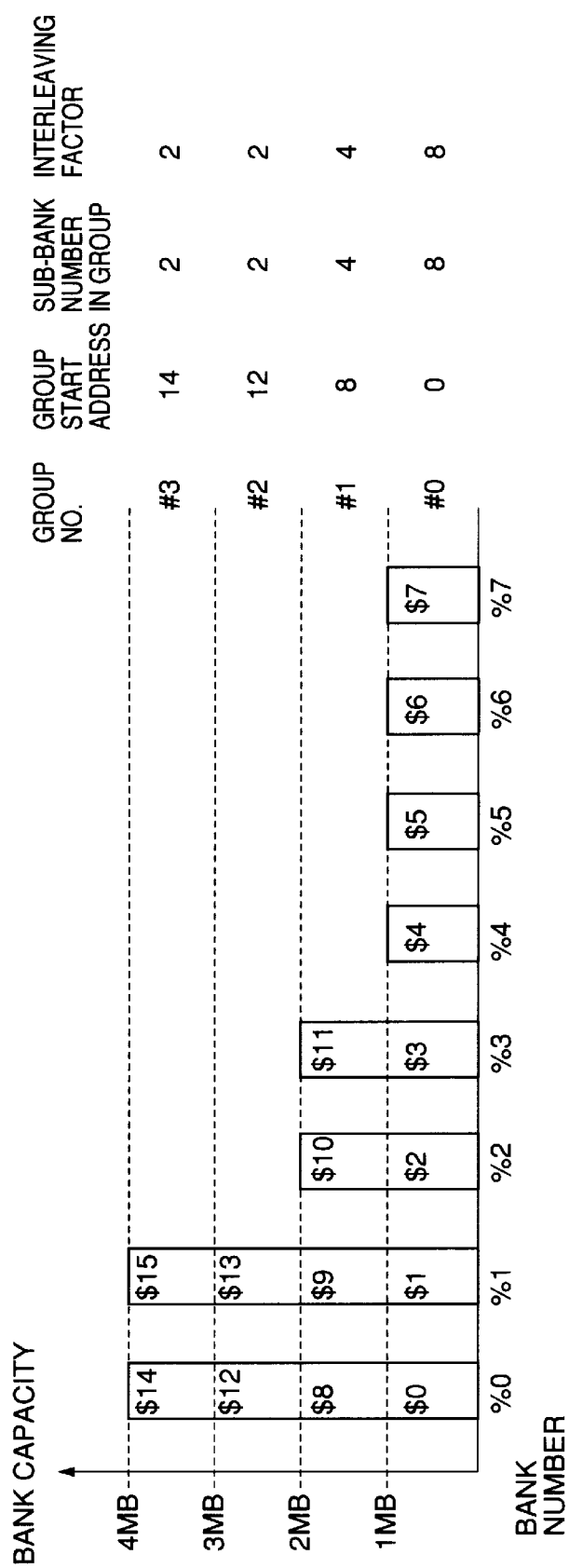
FIG. 2 is a diagram showing an exemplary interleave according to the present invention.

Referring to FIG. 2, in the embodiment of the present invention, the main storage 400 has eight memory banks, each being accessed as an independent bank slot. In FIG. 2, the eight banks are indicated in the horizontal direction, while capacity of each bank is indicated in the vertical direction. In the example shown in FIG. 2, each of the bank slots No. %0 and %1 has a bank whose capacity is 4 MB, each of the bank slots No. %2 and %3 has a bank whose capacity is 2 MB, and each of the bank slots No. %4 to %7 has a bank whose capacity is 1 MB. A sub-bank is indicative of a memory block whose capacity is 1 MB, and a memory module has the capacity equal to a common divisor of the capacity of the sub-bank. Although the capacity of the sub-bank is not actually limited, the unit of the above-described "capacity" is set to 1 mega-byte (MB) for simplification of description.

Referring to FIG. 2, the main storage 400 is divided into four interleave groups #0 to #3. The capacity of 8 MB of sub-bank numbers $0 to $7 is assigned to the interleave group #0, the capacity of 4 MB of sub-bank numbers $8 to $11 is assigned to the interleave group #1, the capacity of 2 MB of sub-bank numbers $12 and $13 is assigned to the interleave group #2, and the capacity of 2 MB of sub-bank numbers $14 and $15 is assigned to the interleave group #3. As a result, the maximum number of interleave ways is 8 ways in an address area of 8 MB from the sub-bank $0, the number of interleave ways (interleaving factor) is 4 ways in the subsequent address area of 4 MB, and the number of interleave ways is 2 ways each in the remaining address area of 4 MB.

Figure 3:
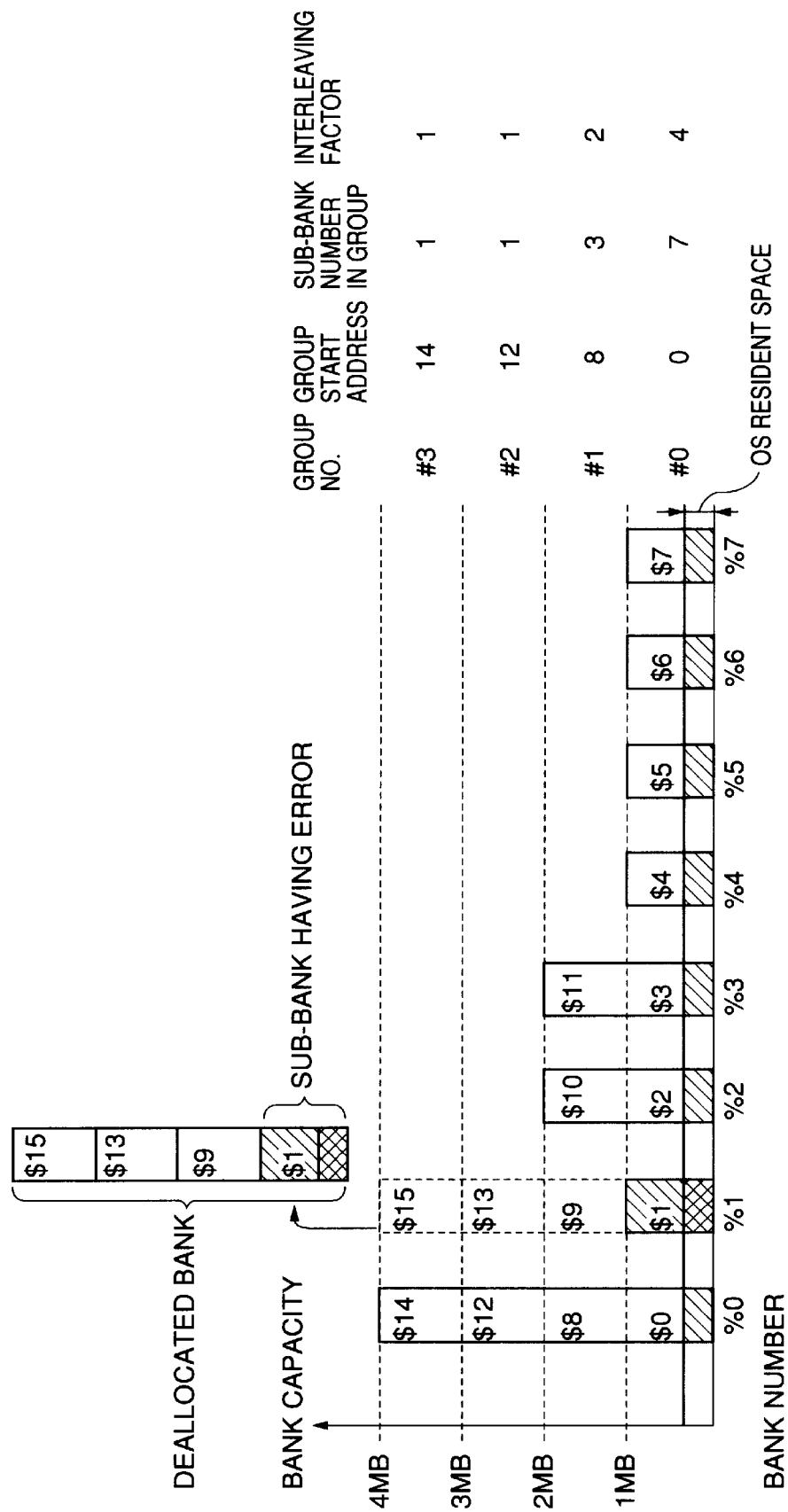
FIG. 3 is a diagram showing a relationship between an OS resident space and a bank according to the present invention.

Referring to FIG. 3, an OS resident space is included in the group #0. As described above, since an assumption is made that the OS resident space must be free of error, when the error is occurred in a page in the group #0, it is not appropriate to deallocate the erroneous page. Furthermore, as shown in FIG. 3, if all the bank %1 is deallocated when the error is detected in the sub-bank $1, the memory of 4 MB is deallocated and thus performance is rapidly deteriorated.

Figure 4:
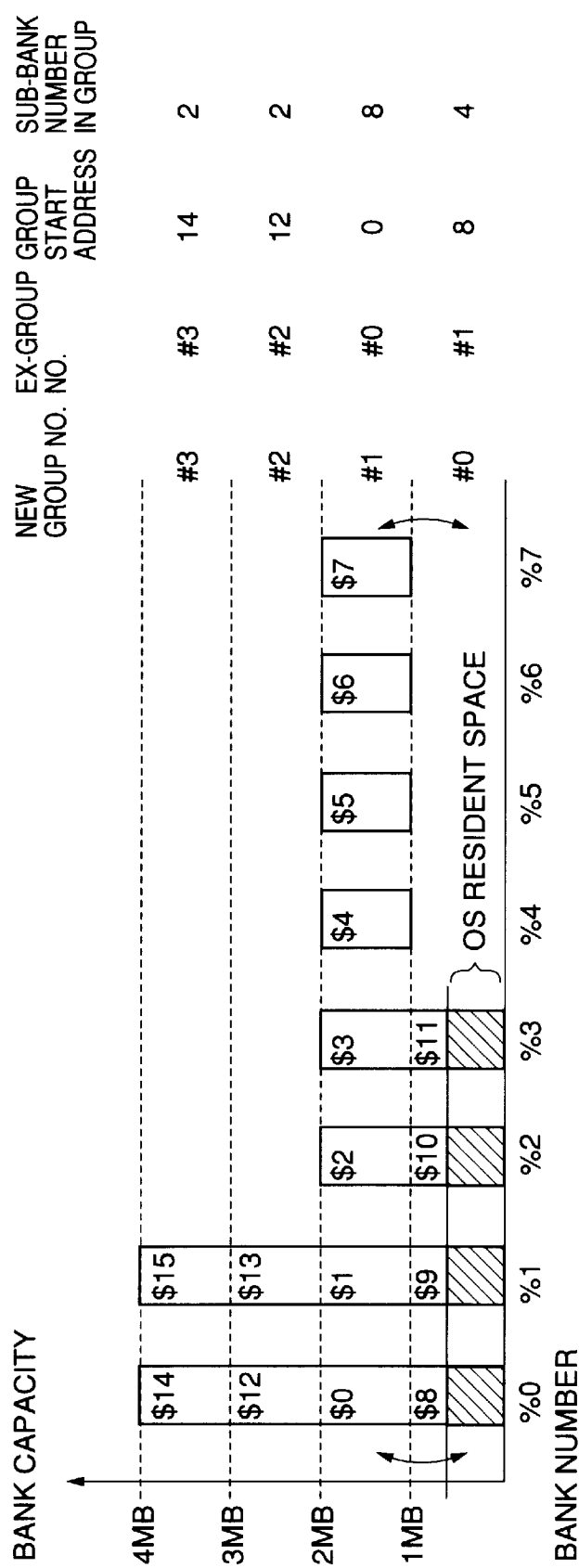
FIG. 4 is a diagram showing a mode after an interchange of bank groups according to the present invention.

Referring to FIG. 4, in the present invention, when the error is occurred in the group #0 which is the OS resident space, all the sub-banks belonging to the group #0 are interchanged with another group. In the example shown in FIG. 4, the original group #0 including the erroneous sub-bank is interchanged with the original group #1, so that the original group #0 is changed into a new group #1 and then the original group #1 is changed into a new group #0.

In such a manner, the OS resident space is kept in the new group #0 having no error. The page including the erroneous area is deallocated in the sub-bank 1 in the new group #1 having the error. Typically, since the capacity of page is much smaller than the capacity of sub-bank, the deallocation of the page alone causes less deterioration of performance.

In the above-mentioned example, although the group to be interchanged is defined as #1, if this group #1 includes the previously troubled memory, the subsequent group #2 is the one to be interchanged. As described below, since an error record is recorded in the SPM 600, the service processor 500 checks the groups in the order of the smaller group number so as to thereby specify the group to be interchanged.

A mechanism for accessing to each memory bank in the main storage 400 in accordance with the bank group interchanged in the above-described manner will be described below.

Figure 5:
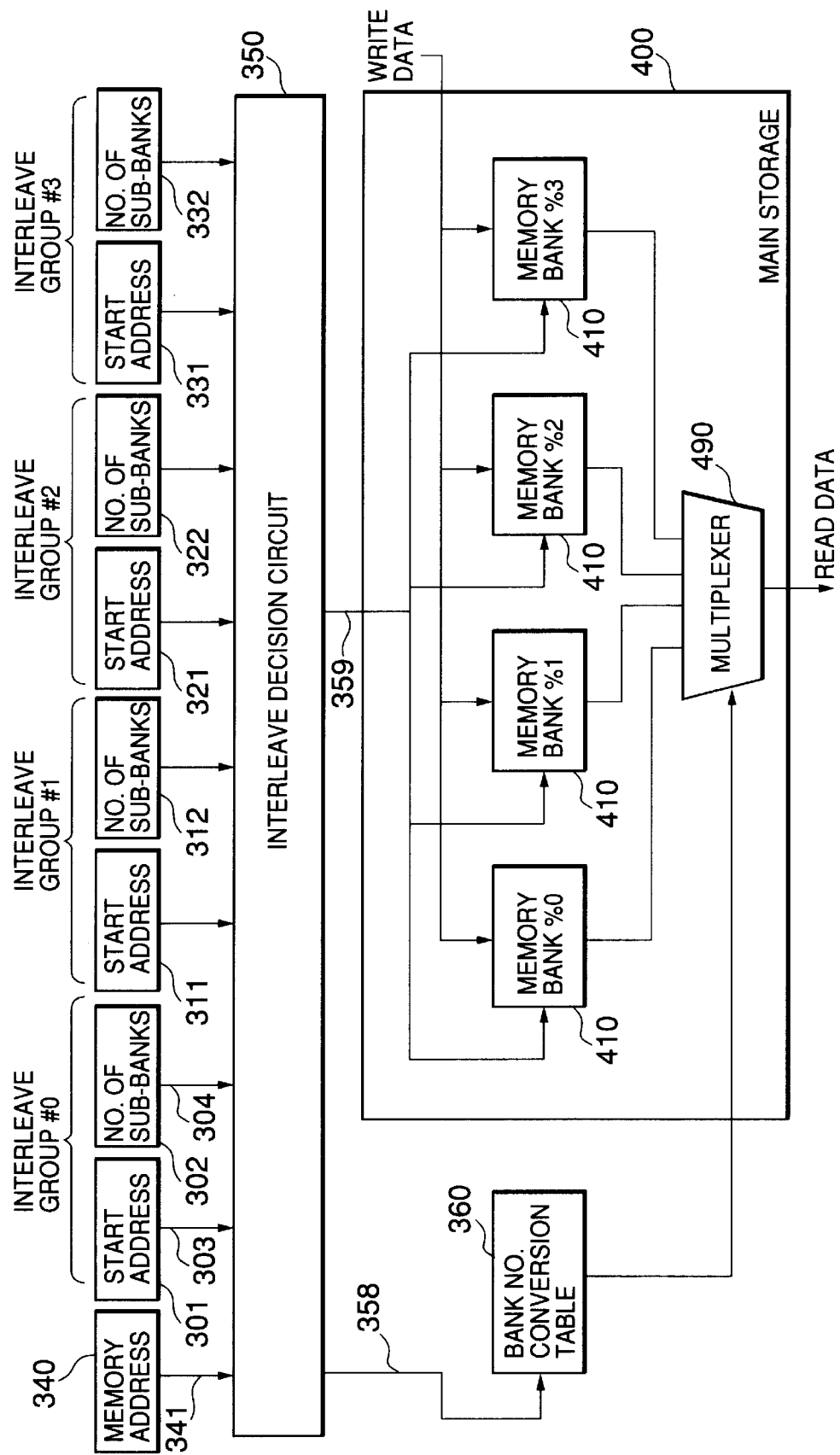
FIG. 5 is a block diagram showing the configuration of a memory controller according to the embodiment of the present invention.

Referring to FIG. 5, in the memory controller 300, when an effective address is set to a memory address register 340, its output is sent to an interleave decision circuit 350. The start address and number of sub-banks of each interleave group are given as the parameters to the interleave decision circuit 350. Herein, the given start address is indicative of the first sub-bank number of each interleave group after the groups are interchanged, and the given number of sub-banks is indicative of the number of sub-banks belonging to the new group.

All of the sub-banks are of the same type and the same capacity, and thus when the number of sub-banks is determined, the memory capacity of the relevant group is also determined. For the assignment of the start address, the start address of the sub-bank of the interleave group #0 after the interchange of groups of FIG. 4 is set to 8, and it is then assigned without any gap and overlap of address in the sequence of the interleave groups #1, #2 and #3.

Upon reception of the memory address under the condition of access request, the interleave decision circuit 350 decides the group number by comparing this memory address with the address range assigned to each interleave group, and outputs the bank number to be activated and the address in the bank by computing so as to see which sub-bank in the interleave group is to be accessed.

Referring to FIG. 5, the memory controller of the embodiment of the present invention is assumed to have four interleave groups. The memory controller includes start address registers 301, 311, 321, 331 for holding the starting addresses for the respective interleave groups, and sub-bank number registers 302, 312, 322, 332 for holding the sub-bank numbers for the respective interleave groups. These start addresses and sub-bank numbers are input to the interleave decision circuit 350. Moreover, a memory address 341 to be accessed is input to the interleave decision circuit 350 from the memory address register 340.

The interleave decision circuit 350 outputs a bank number 358 and an address 359 in the bank in accordance with the above-described input.

A bank number conversion table 360 converts the logical bank number 358 output from the interleave decision circuit 350 into a physical bank number.

A main storage 400 has four memory banks 410. When the memory access is based on a read request, a multiplexer 490 selects one output from any one of the memory banks 410 as the read data, depending on the physical bank number received from the bank number conversion table 360.

In the example given in FIG. 5, the number of interleave groups and the number of memory banks are set to four, but this value is determined only for the convenience for explanation, and this value can be set freely depending on the requirements of the system.

Referring to FIG. 5, when an effective address is set to the memory address register 340, its output is sent to the interleave decision circuit 350. The start address and number of sub-banks of each interleave group are given as the parameters to the interleave decision circuit 350. In the embodiment, all of the sub-banks are assumed to be of the same type and the same capacity, and thus when the number of sub-banks is determined, the memory capacity of the relevant group is also determined. For the assignment of the start address, like an example in the eight banks of FIG. 2, the start address of the interleave group #0 is assumed to be set to "0" and it is assigned without any gap and overlap of address in the sequence of the interleave groups #1, #2 and #3. Setting is done by software or hardware at the time when the device is constructed or when the device is changed in structure. Upon reception of the memory address under the condition of access request, the interleave decision circuit 350 decides the group number by comparing the memory address with the address range assigned to each interleave group, and outputs the bank number to be activated and the address in the bank by computing so as to see which sub-bank in the interleave group is to be accessed.

The bank number decided by the interleave decision circuit 350 is a logical bank number, and it is necessary for the actual access to the bank to convert the logical bank number into the physical bank number corresponding to the loading position. The bank number conversion table 360 converts the logical bank number 358 to the physical bank number. The main storage 400 then makes access to the memory bank 410 corresponding to the physical bank number.

In this embodiment, the selected physical bank number is used only as a selection signal for selecting the read data of the banks, but, in practice, it can be widely used as various control signals for the bank, such as an address strobe signal, and as an input signal to the logic corresponding to each memory bank for bank busy management or the like.

Meanwhile, the bank address 359 output from the interleave decision circuit 350 is determined, in the selected bank, on the basis of the sub-bank number occupied by the interleave group and offset address in the sub-bank.

Figure 6:
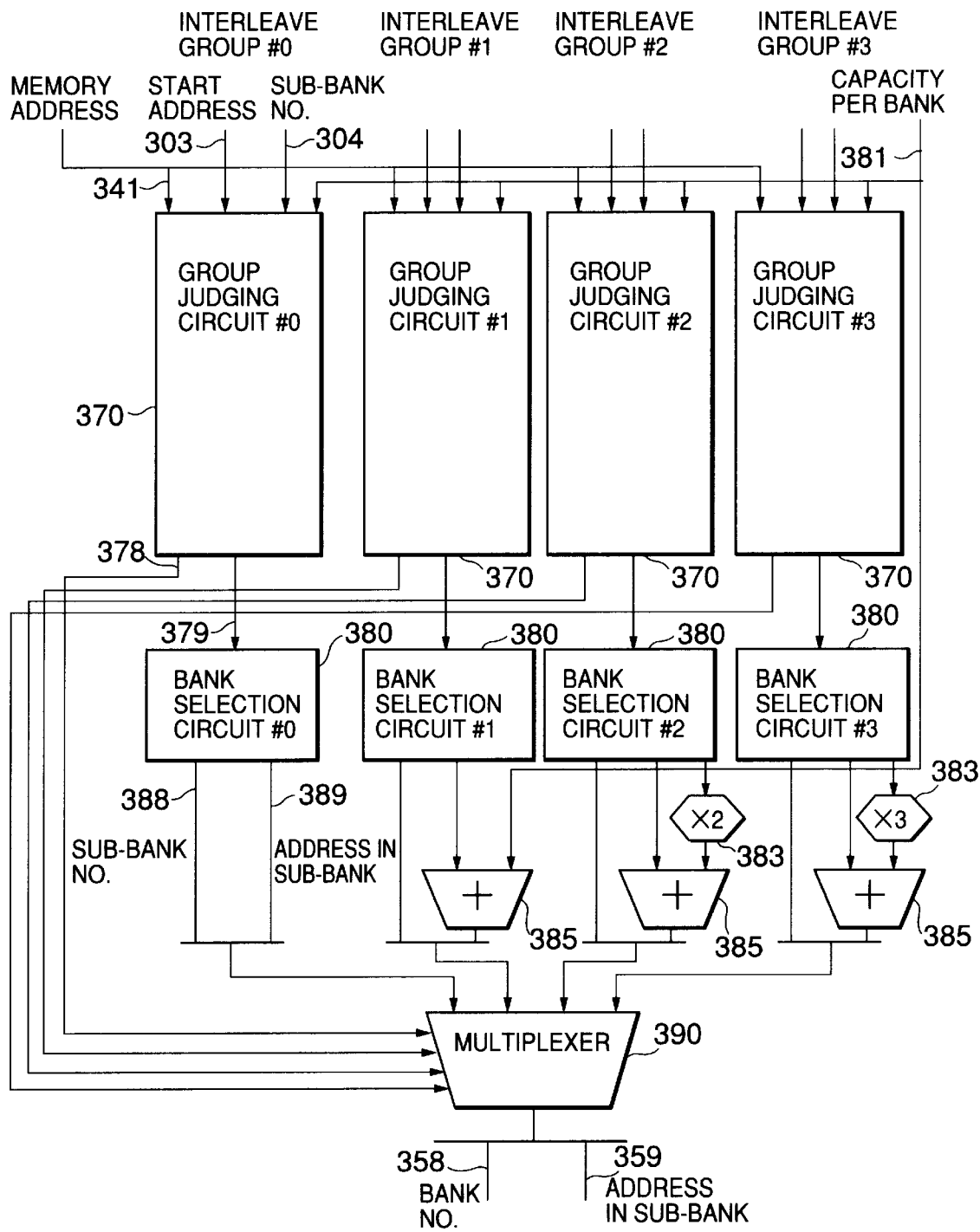
FIG. 6 is a block diagram showing the configuration of an interleave decision circuit 350 according to the embodiment of the present invention.

Referring to FIG. 6, the interleave decision circuit 350 includes a plurality of pairs, where each pair corresponds to a group judging circuit 370 and a bank selection circuit 380, with the number of pairs corresponding to the number of interleave groups. In this embodiment, the number of interleave groups is set to four, but, of course, this number can be set freely depending on the requirements of the system. Moreover, in the actual design stage, some part may be shared with the circuits for the different interleave groups, but the invention will be described with reference to the same type logic for each interleave group, in order to conceptually describe the present invention.

Figure 7:
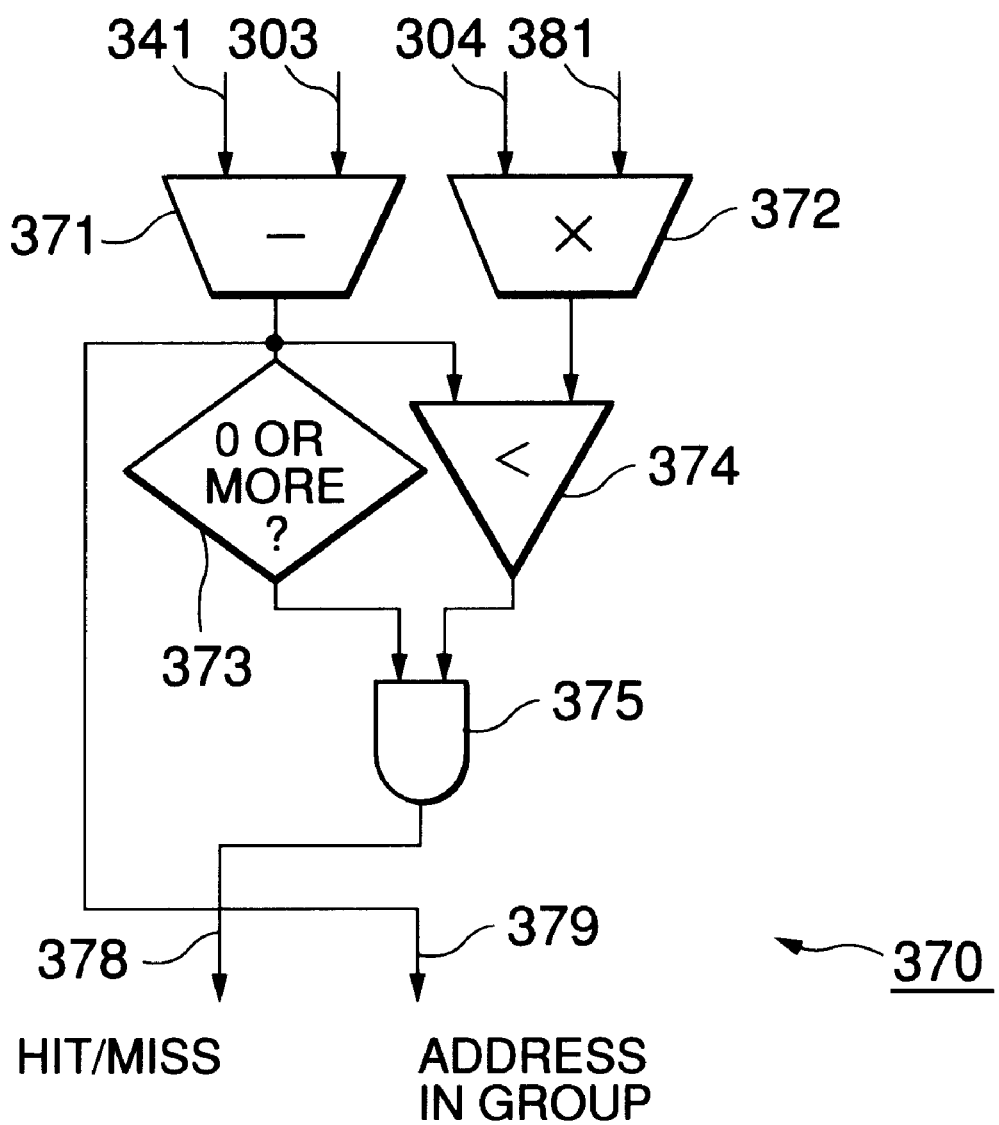
FIG. 7 is a block diagram showing the configuration of a group judging circuit 370 according to the embodiment of the present invention.

Referring to FIG. 7, when the memory address 341 is input, each group judging circuit 370 judges which address range of the interleave group this address falls in. For this purpose, the start address 303 of each group is first subtracted from the requested memory address 341 by a subtractor 371. This subtraction result is judged by a zero judging circuit 373. If the result is negative, it is determined that the input memory address is smaller than the start address and is located outside of the range of the interleave group. On the other hand, when the subtraction result is positive or zero, the upper limit test is then executed because the memory address 341 is at least larger than the lower limit of the address range of the interleave group.

Since the above-described subtraction result corresponds to the offset address in the interleave group, if the upper limit test shows that the subtraction result is within the range of the group capacity, the determination can be made that the memory address does not exceed the upper limit. The capacity of the interleave group is given as the product of the number 304 of sub-banks and the capacity 381 of each sub-bank in the interleave group. Therefore, if the offset address is smaller than the group capacity when an output of a multiplier 372 is compared with the offset address (subtraction result) of the interleave group by a comparator 374, it is determined that the input memory address exists in the relevant group. When the memory address exists in the interleave group, it is called a "hit" condition, and, on the contrary, when the memory address does not exist in the interleave group, it is called a "miss" condition. Namely, a result 378 obtained when a logical product of an output of the zero judging circuit 373 and an output of the comparator 374 is generated in a logical product gate 375 indicates the "hit" condition or "miss" condition. Moreover, an output of the subtractor 371 is output as an address 374 in the group. The capacity 381 of one sub-bank may be provided externally to the interleave decision circuit 350, or may be held in a register provided within the interleave decision circuit 350.

Figure 8:
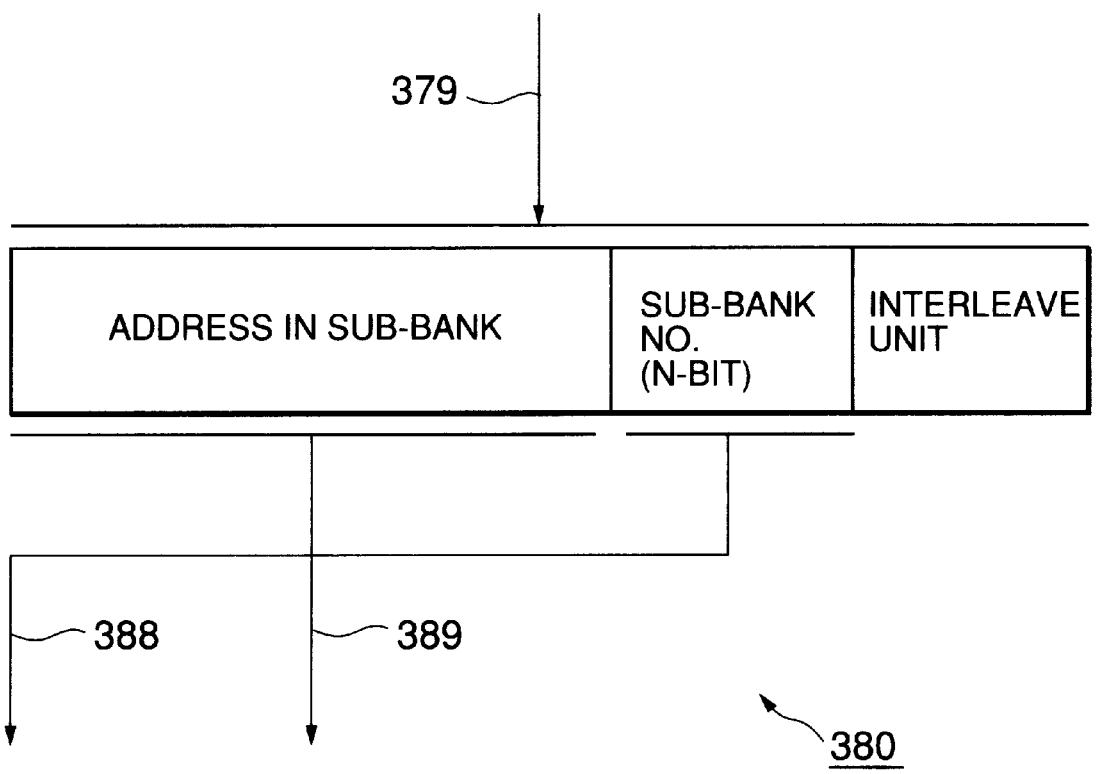
FIG. 8 is a block diagram showing the configuration of a bank selection circuit 380 according to the embodiment of the present invention.

When the corresponding interleave group number is detected in the above-described manner, the bank selection circuit 380 decides as to what address of which sub-bank in the interleave group the access should be made. Referring to FIG. 8, the bank selection circuit 380 outputs a part of the address to be used for interleave as a bank number 388, and another part of the address as an address 389 in the sub-bank. At this time, the bank selection circuit 380 does not output a remaining part of the address that corresponds to the unit of interleave. More specifically, for example, assuming that interleave is executed in every four byte in a 32-bit memory address space with the multiplexing degree of interleave of 8-way, the lower two bits are ignored, the upper three bits become the bank number 388, and the remaining 27 bits become the address 389 in the sub-bank.

However, in this embodiment, since the sub-bank capacity is assumed to be 1 MB, the upper nine bits in the 27 bits are set to "0" at all times, and only the lower 18 bits are substantially used as the address in the sub-bank. Namely, in the case of executing the interleave whose multiplexing degree is given by the N-th power of 2, the N bits are consequently used as the bank number 388.

Referring to FIG. 6, an output of the bank selection circuit 380 is input to a multiplexer 390 as the bank number and address in the bank, and selected. Here, assuming that each logical bank is assigned in the sequence of larger capacity, the sub-bank number matches with the logical bank number. On the other hand, the address in the bank matches with the address in the sub-bank in the interleave group #0, but they do not match with each other in the other interleave groups. In order to convert the address in the sub-bank into the address in the bank, a constant address must be added in response to the interleave group number. That is, in the case of the interleave group #1, the value obtained by adding one sub-bank capacity to the address in the sub-bank is used as the address in the bank. In the same manner, in the case of the interleave group #2, the value obtained by adding two sub-bank capacities to the address in the sub-bank is used as the address in the bank, while in the case of the interleave group #3, the value obtained by adding three sub-bank capacities is used as the address in the bank. This computation is carried out in a multiplier 383 and an adder 385.

A procedure for recovering the memory error when it occurs according to the present invention will be described below.

Figure 9:
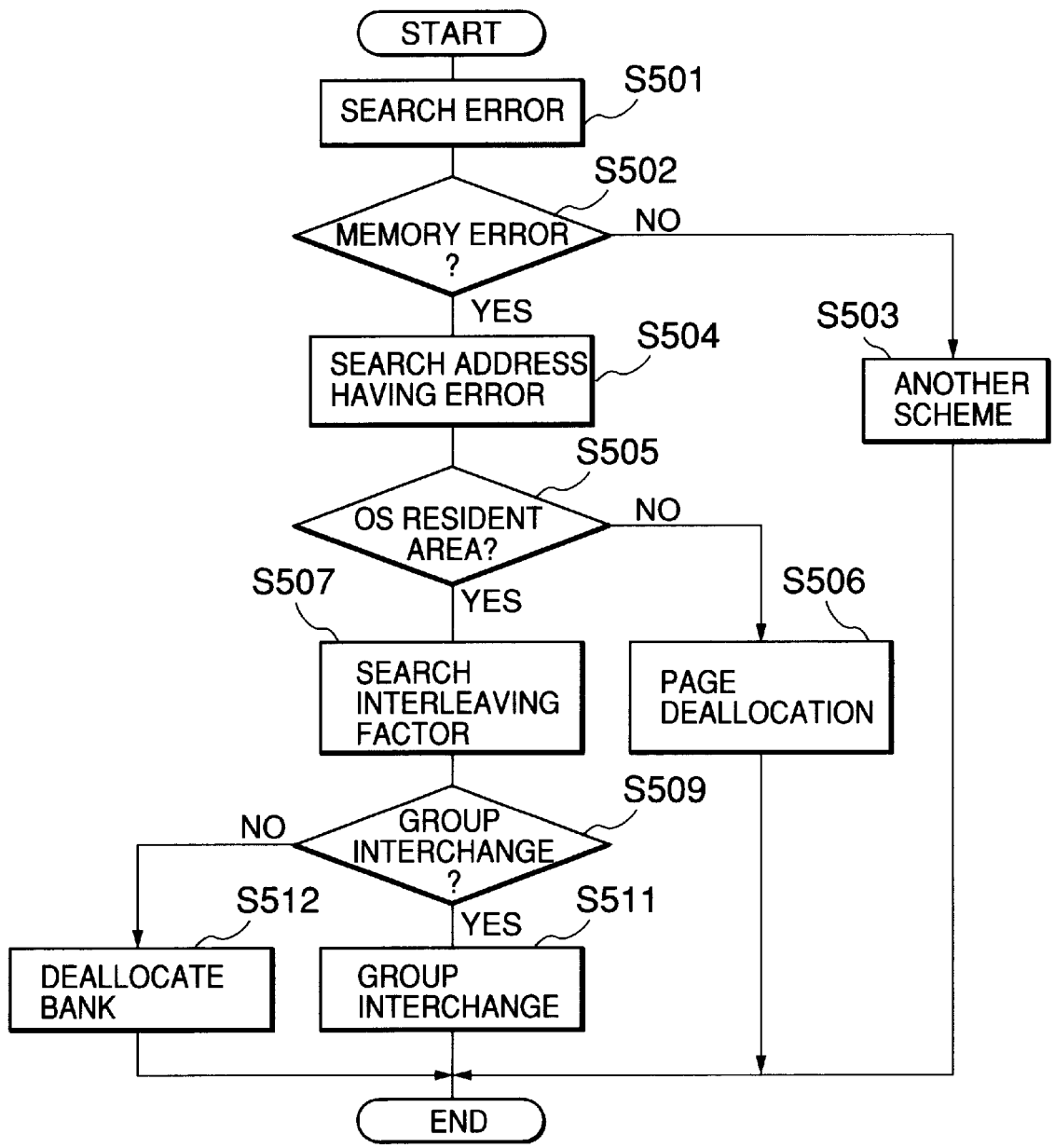
FIG. 9 is a flow chart showing an operation which is executed when a memory error is occurred according to the present invention.

Referring to FIG. 9, when any error is detected in the hardware, the service processor 500 searches to determine what kind of error it is (step S501). If the determination is made that a part other than the memory causes the error, any solution is implemented in the hardware or software by another scheme (step S503).

If the memory error is detected, a sub-block address having the error is searched (step S504). An analysis is carried out so as to see whether or not the address is located in a kernel resident area (step S505). If the address is not located in the kernel resident area, the page is deallocated (step S506). On the other hand, if the address is located in the kernel resident area, the determination is made as to whether or not the group interchange is executed (step S509). This determination contents will be described below.

If the group interchange is executed, the contents of the start address registers and sub-bank number registers shown in FIG. 5 are interchanged (step S511). On the other hand, if the group interchange is not executed, the contents of the start address registers and sub-bank number registers remain unchanged while the bank having the error is deallocated (step S512). The bank deallocation is accomplished by deallocating the physical bank number and then advancing the subsequent physical bank number in the bank number conversion table 360 shown in FIG. 5. After the bank deallocation, for example, if the original interleaving factor is 8-way, the factor is deallocated to 7-way. In this case, for a simple control, the interleaving factor of 4-way that is equal to the second power of 2 may be used.

Figure 10:
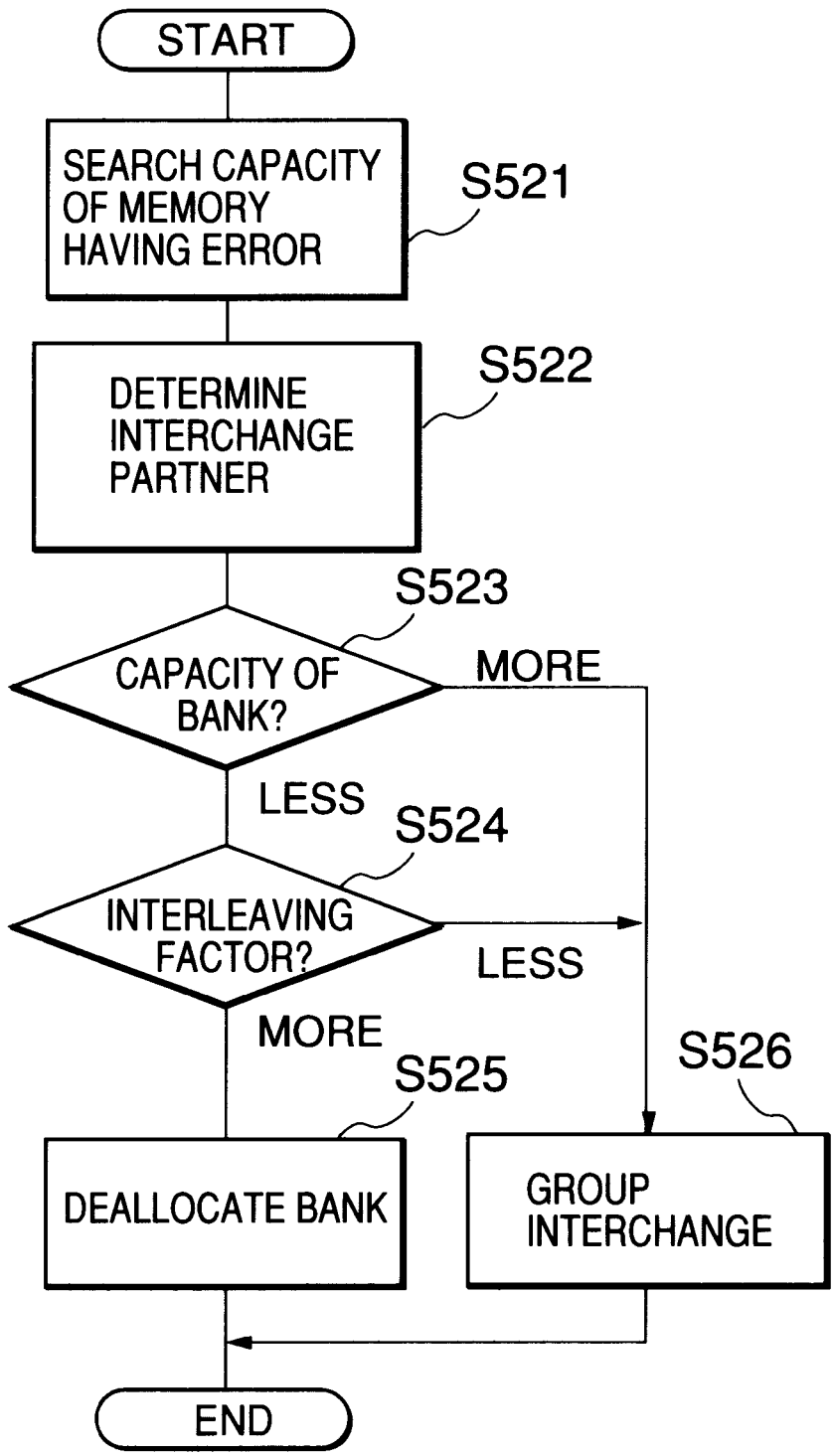
FIG. 10 is a flow chart showing the operation for judging whether or not the groups are interchanged according to the present invention.

Referring to FIG. 10, there is shown a flow chart of the determination as to whether or not the group interchange is executed in step S509 of FIG. 9. When the memory error is detected, the service processor 500 makes a check of the capacity of the bank having the error (step S521). Then, the group to be an interchange partner is determined (step S522). For the determination of this partner, a check is made in the order of the smaller group number so as to see whether or not the error has been detected in the past, and then the determination is made that the group previously having no error should be the interchange partner. The error record is held in the SP memory 600 connected to the service processor 500, for example.

When the interchange partner is determined, the determination is made as to whether or not the capacity of the bank including the erroneous sub-bank is equal to or less than a predetermined rate of all the memory capacity (step S523). Then, the determination is made as to whether or not the interleaving factor, calculated after the bank deallocation for the bank having the erroneous sub-bank, is equal to or less than the interleaving factor of the above partner (step S524). When the capacity of the bank, including the erroneous sub-bank, is equal to or less than a predetermined rate of all the memory capacity and the interleaving factor, calculated after the bank deallocation for the bank having the erroneous sub-bank, is more than the interleaving factor of the above partner, the bank deallocation is executed (step S525). In other cases, the group interchange is executed (step S526). The above-mentioned "predetermined rate" can be freely defined depending on various factors of the requirements of the system.

Although, in the above-described embodiment, the determination is made as to whether or not the group interchange is executed by a predetermined algorithm, this determination may be made in accordance with a predefined table, for example. An assumption may be also made that the group interchange is uniformly executed.

As described above, according to the present invention, as a method of avoiding the memory error in the kernel resident area, it is possible to select one of two methods which causes less deterioration of performance: where the two methods are a method of the page deallocation by removing the erroneous area from the error-free space by the group interchange and a method of deallocating the memory module (bank). Therefore, it is possible to realize a high-performance storage device using an interleave system of banks of different capacities.

What is claimed is:

1. A memory controller for a storage device for forming interleave groups by dividing each of a plurality of memory banks into sub-banks and then combining sub-banks belonging to different memory banks, said memory controller generating addresses in the memory banks of said plurality of memory banks so as to form an interleave within each of said interleave groups in accordance with an address of said storage device, wherein when a memory error is detected in a kernel resident area, one of two schemes is selected, the two schemes being a first scheme of deallocating a memory bank having said memory error and a second scheme of interchanging the interleave group having said memory error with another interleave group.

2. The memory controller according to claim 1, wherein if a capacity of said memory bank having said memory error is equal to or less than a predetermined rate of all the memory capacity and an interleaving factor after said bank allocation is more than the interleaving factor of an interchange partner, said first scheme is selected otherwise said second scheme is selected.

3. The memory controller according to claim 1, wherein when the memory error is detected in a location other than said kernel resident area, a page having said memory error is deallocated.

4. A memory controller for a storage device for forming interleave groups by dividing each of a plurality of memory banks into sub-banks and then combining sub-banks belonging to different memory banks, said memory controller generates addresses in the banks of said plurality of memory banks so as to form an interleave within each of said interleave groups in accordance with the address of said storage device, said memory controller comprising:

means for detecting a memory error;

means for determining whether to execute an interchange of said interleave groups if said detecting means detects the memory error in a kernel resident area; and means for interchanging the interleave group having the memory error with another interleave group if said determining means determines that interchanging said interleave groups should be executed.

5. The memory controller according to claim 4, further comprising:

means for deallocating a page having said memory error if said detecting means detects the memory error in a location other than said kernel resident area.

6. An information processing system including a memory controller for a storage device for forming interleave groups by dividing each of a plurality of memory banks into sub-banks and then combining the sub-banks belonging to different memory banks and for generating addresses in the banks of said plurality of memory banks so as to form an interleave within each of said interleave groups in accordance with the address of said storage device, said memory controller comprising:

means for detecting a memory error;

means for determining whether to execute an interchange of said interleave groups if said detecting means detects the memory error in a kernel resident area; and means for interchanging the interleave group having the memory error with another interleave group if said determining means determines that interchange of said interleave groups should be executed.

7. The system according to claim 6, comprising:

means for storing a record of said memory error; and means for deciding that the interleave group which previously did not have said memory error should be an interchange partner in accordance with the contents of said memory error record storing means.

8. A storage device for forming interleave groups by dividing each of a plurality of memory banks into sub-banks and then combining the sub-banks belonging to different memory banks, a memory controlling method for generating addresses in the banks of said plurality of memory banks so as to form an interleave within each of said interleave groups in accordance with the address of said storage device, said method comprising:

detecting a memory error;

determining whether to execute an interchange of said interleave groups if said detecting means detects the memory error in a kernel resident area; and interchanging the interleave group having the memory error with another interleave group if it is determined that the interchange of said interleave groups should be executed.

9. The method according to claim 8, wherein it is determined that said interchange of said interleave groups should be executed if capacity of said memory bank having said memory error is more than a predetermined rate of all the memory capacity or an interleaving factor after said bank allocation is equal to or less than the interleaving factor of an interchange partner.

10. The method according to claim 8, further comprising:

determining whether or not the sub-bank having said memory error is located in a kernel resident area; and deallocating the page having said memory error if it is determined that the sub-bank having said memory error is not located in the kernel resident area.

11. In a storage device for forming interleave groups by dividing each of a plurality of memory banks into sub-banks and then combining sub-banks belonging to different memory banks, a computer readable storage medium recording thereon a program for generating addresses in the banks of said plurality of memory banks so as to form an interleave within each of said interleave groups in accordance with the address of said storage device, said program enabling a computer to perform:

detecting a memory error;

determining whether interchange of said interleave groups should be executed if said detecting means detects a memory error in a kernel resident area; and interchanging the interleave group having the memory error with another interleave group if it is determined that interchange of said interleave groups should be executed.

12. The computer readable storage medium according to claim 11, wherein it is determined that said interchange of said interleave groups should be executed if capacity of said memory bank having said memory error is more than a predetermined rate of all the memory capacity or an interleaving factor after said bank allocation is equal to or less than the interleaving factor of an interchange partner.

13. The memory controller according to claim 4, wherein said determining means determines that an interchange of the interleave groups is executed if a capacity of said memory bank having said memory error is more than a predetermined rate of all the memory capacity.

14. The memory controller according to claim 8, wherein said determining means determines that an interchange of the interleave groups is executed if a capacity of said memory bank having said memory error is more than a predetermined rate of all the memory capacity.

15. The memory controller according to claim 11, wherein said determining means determines that an interchange of the interleave groups is executed if a capacity of said memory bank having said memory error is more than a predetermined rate of all the memory capacity.

16. The memory controller according to claim 4, further comprising: means for deallocating the memory bank having memory error if said determining means determines that the interchange of said interleave groups should not be executed.

17. The memory controller according to claim 4, wherein said determining means determines that interchange of said interleave groups should be executed if capacity of said memory bank having said memory error is equal to or less than a predetermined rate of all the memory capacity and an interleaving factor after said bank allocation is equal to or less than the interleaving factor of an interchange partner.

* * * * *

UNITED STATES PATENT AND TRADEMARK OFFICE
CERTIFICATE OF CORRECTION

PATENT NO. : 6,170,039 B1
DATED : January 2, 2001
INVENTOR(S) : Kishida, Yuichi

It is certified that error appears in the above-identified patent and that said Letters Patent is hereby corrected as shown below:

<u>Column 4,</u>
Line 61, delete the 2$^{nd}$ occurrence of "for" insert -- of --

<u>Column 5,</u>
Line 25, delete "makes access" insert -- accesses --

<u>Column 6,</u>
Line 16, delete "374" insert -- 379 --

<u>Column 7,</u>
Line 2, delete "causes" insert -- caused --;
Line 2, delete "any" insert -- a --;
Line 11, delete "the" insert -- a --

<u>Column 10,</u>
Line 19, delete "more" insert -- equal to or less --;
Line 2, delete "or an" insert -- and --

Signed and Sealed this

Sixteenth Day of July, 2002

*Attest:*

JAMES E. ROGAN
*Attesting Officer*   *Director of the United States Patent and Trademark Office*